US006566029B2

(12) United States Patent
Kawamura et al.

(10) Patent No.: US 6,566,029 B2
(45) Date of Patent: May 20, 2003

(54) LITHOGRAPHIC PRINTING PLATE PRECURSOR

(75) Inventors: Koichi Kawamura, Shizuoka (JP); Kazuo Maemoto, Shizuoka (JP); Miki Takahashi, Shizuoka (JP); Hidekazu Oohashi, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 10/013,469

(22) Filed: Dec. 13, 2001

(65) Prior Publication Data

US 2002/0117066 A1 Aug. 29, 2002

(51) Int. Cl.[7] ............................ G03F 7/038; G03F 7/09

(52) U.S. Cl. ................. 430/138; 430/270.1; 430/271.1; 430/302; 430/348; 101/453; 101/467

(58) Field of Search .............................. 430/138, 270.1, 430/271.1, 281.1, 302, 348, 944, 945, 964; 101/130, 453, 454, 463.1, 465, 466, 467

(56) References Cited

U.S. PATENT DOCUMENTS 6,030,750 A * 2/2000 Vermeersch et al. ........ 430/302
6,096,481 A * 8/2000 Vermeersch et al. ........ 430/302
6,461,792 B1 * 10/2002 Kawamura et al. ...... 430/271.1
2001/0019760 A1 * 9/2001 Kawamura et al. .......... 428/195
2002/0023565 A1 * 2/2002 Kawamura et al. .......... 101/453
2002/0106583 A1 * 8/2002 Kawamura et al. ...... 430/271.1
2002/0142247 A1 * 10/2002 Kawamura et al. ...... 430/270.1
2002/0155375 A1 * 10/2002 Pappas et al. ........... 430/270.1

FOREIGN PATENT DOCUMENTS

| | | | | |
|---|---|---|---|---|
| EP | 1 216 831 A1 | * | 6/2002 | ............. B41C/1/10 |
| JP | 2938397 | | 6/1999 | |
| JP | 2002-166672 A | * | 6/2002 | ............ B41N/1/14 |
| WO | WO 94/23954 | * | 10/1994 | ............ B41N/1/14 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A lithographic printing plate precursor comprising a support having a hydrophilic surface containing hydrophilic graft polymer chains and a heat-sensitive layer containing at least either of fine particulate polymer and microcapsules, which is excellent in on press developing property, sensitivity and printing durability.

6 Claims, No Drawings

LITHOGRAPHIC PRINTING PLATE PRECURSOR

FIELD OF THE INVENTION

This invention relates to a negative-working lithographic printing plate precursor. More particularly, it relates to a lithographic printing plate precursor which enables plate making by scan exposure based on digital signals, which shows a high sensitivity and a high printing durability, which can produce stain-free prints, and which can be mounted on a printing press without conducting a special development processing after image formation.

BACKGROUND OF THE INVENTION

A number of studies have been made on printing plates for use in the computer-to-plate system having a remarkable development. In the course of the studies, lithographic printing plate precursors which can be mounted on a printing press without being subjected to development processing after imagewise exposure have been studied, and various methods have so far been proposed.

As one method which does not require the development processing, there is a method, called an on press developing method, which comprises mounting an exposed printing plate precursor on a cylinder of a printing press and removing non-image areas of the printing plate precursor by feeding a dampening water and an ink while rotating the cylinder. That is, it is a method of mounting an exposed printing plate precursor on a printing press and completing development processing during the common printing procedures.

A lithographic printing plate precursor adapted for such on press development is required to have a light-sensitive layer soluble in the dampening water or an ink solvent and such bright room handling properties that it can be developed on a printing press placed in a bright room.

For example, Japanese Patent No. 2938397 discloses a lithographic printing plate precursor comprising on a hydrophilic support a heat-sensitive layer wherein fine particles of a thermoplastic hydrophobic polymer are dispersed in a hydrophilic binder polymer. In this patent, it is described that, in the lithographic printing plate precursor, the fine particles of the thermoplastic hydrophobic polymer are fused to each other by heat generated by an infrared laser exposure to thereby form an image, and that the resulting printing plate can be mounted on a cylinder of a printing press and on press developed with a dampening water and/or an ink.

However, in the method of forming an image merely by thermally fusing the thermoplastic polymer, the plate has such a weak strength in image areas of the recording layer that there results insufficient printing durability, though non-image areas show a good on press developability. In the case of providing a heat-sensitive layer directly on an aluminum substrate conventionally used as a substrate in the lithographic printing plate precursor, the heat generated by exposure predominantly conducts to the aluminum substrate having a high heat conductivity, and hence the heat energy is not well utilized for image formation, i.e., for thermally fusing the fine particles, in the vicinity of the interface between the substrate and the heat-sensitive layer, resulting in insufficient printing durability.

SUMMARY OF THE INVENTION

The present invention provides a lithographic printing plate precursor which solves the above-described problems in the prior art. That is, it provides a lithographic printing plate precursor having a good on press developability, high sensitivity and excellent printing durability.

As a result of various investigations to solve the above-described problems, the inventors have found that, in order to enhance the sensitivity and printing durability, it is most important to prevent the generated heat from predominantly conducting to the aluminum substrate and, as a result of examining various heat-insulating and hydrophilic supports, have found that a support having a hydrophilic surface comprising a graft polymer has a high hydrophilicity and an excellent heat-insulating effect, to complete the invention. Specifically, the invention includes:

(1) A lithographic printing plate precursor which comprises a support having a hydrophilic surface containing hydrophilic graft polymer chains and a heat-sensitive layer containing at least either of fine particulate polymer and microcapsules.

(2) The lithographic printing plate precursor as described in (1), wherein the fine particulate polymer is a thermoplastic fine particulate polymer.

(3) The lithographic printing plate precursor as described in (1), wherein the fine particulate polymer is a fine particulate polymer having a heat-reactive functional group.

(4) The lithographic printing plate precursor as described in (1), wherein the microcapsules retain a compound having a heat-reactive functional group.

(5) The lithographic printing plate precursor as described in (1), wherein the fine particulate polymer is a thermoplastic fine particulate polymer having a functional group capable of mutually acting with the hydrophilic graft polymer.

(6) The lithographic printing plate precursor as described in (1), wherein the microcapsules are microcapsules retaining a compound having a functional group capable of mutually acting with the hydrophilic graft polymer.

The present invention is described in more detail below.

The lithographic printing plate precursor of the invention comprises a support having a specific hydrophilic surface and a heat-sensitive layer containing fine particulate polymer or microcapsules.

In the invention, the support is provided with a hydrophilic surface wherein hydrophilic graft polymer chains exist. This surface has a high hydrophilicity and exhibits an excellent heat-insulating effect owing to the polymer layer and, therefore, the heat generated in the heat-sensitive layer does not diffuse into the aluminum substrate but is effectively used for image formation, thus sensitivity is more enhanced. In the heat-sensitive layer of the lithographic printing plate precursor of the invention, the fine particulate compound or the compound contained in the inside of the microcapsules is fused in exposed areas to form image areas. By introducing into the compound a functional group capable of mutually acting with the hydrophilic graft polymer component on the support, strong bonds are formed with the hydrophilic graft polymer, thus a lithographic printing plate precursor having high printing durability is obtained. In addition, in the non-image areas, the support surface is highly hydrophilic, and the high molecular compound participating image formation, which is neither fused nor make mutual action with the hydrophilic graft polymer chains, can easily be dispersed and removed with a small amount of water or a hydrophilic component, thus excellent on press developability is obtained as well.

(A) Support Having a Hydrophilic Surface Wherein Hydrophilic Graft Polymer Chains Exist First, the hydrophilic surface of support is described.

The hydrophilic surface of the support of the invention means a surface wherein hydrophilic graft polymer chains exist. In the surface, the hydrophilic graft polymer chains may directly be bound to the surface of the support or, alternatively, a polymer compound wherein the hydrophilic graft polymer chains are bound to the main chain of the polymer compound may be bound to the surface of the support or may be provided by coating or by coating followed by crosslinking. In the invention, the hydrophilic graft polymer chains directly bound to the surface of the support is referred to as "surface graft", and the layer in which the hydrophilic graft polymer chains are introduced into a crosslinked polymer film structure is referred to as "hydrophilic graft chain-introduced crosslinked hydrophilic layer".

Surface Graft Method

The surface formed by the surface graft method means a surface formed by grafting a monomer by a conventionally known graft polymerization method using, for example, light, an electron beam or heat. The monomer used may be a monomer having a positive charge such as ammonium or phosphonium or a monomer having a negative charge or an acid group capable of being dissociated to form a negative charge such as a sulfonic acid group, a carboxyl group, a phosphoric acid group or a phosphonic acid group, or may be a monomer having a nonionic group such as a hydroxyl group, an amido group, a sulfonamido group, an alkoxy group or a cyano group.

A graft polymerization method is a method of imparting active sites to the chain of a high molecular compound, initiating polymerization of other monomer from the active sites to form a graft polymer. In particular, in a case where the high molecular compound forming the active sites constitutes a surface of a solid, the graft polymerization is called surface graft polymerization.

In order to conduct the surface graft polymerization according to the invention, any of known methods described in literature may be employed. For example, a photo graft polymerization method and a plasma-irradiating graft polymerization method are described in "Shin Kobunshi Jikkengaku 10" compiled by Kobunshi Gakkai, p135, Kyoritu Shuppan Co., Ltd. (1994). In addition, in "Kyuchaku Gijutsu Binran (Adhesion Technology Handbook)" supervised by Takeuchi, p.203 and p.695, NTS Co., Ltd. (February 1999), a radiation-irradiating graft polymerization method using a gamma ray or an electron beam is described.

Specific photo graft polymerization methods described in JP-A-63-92658, JP-A-10-296895 and JP-A-11-119413 (the term "JP-A" as used herein means an "unexamined published Japanese patent application") are also used.

Another method for forming a surface having formed thereon the surface graft polymer comprises providing a reactive functional group such as a trialkoxysilyl group, an isocyanate group, an amino group, a hydroxyl group or a carboxyl group to the terminal of the high molecular compound and conducting a coupling reaction between the terminal functional group and a functional group existing on the surface of the support.

The plasma-irradiating graft polymerization method and the radiation-irradiating graft polymerization method may also be conducted according to methods described in Y. Ikada et al, "Macromolecules", vol.19, p.1804 (1986). Specifically, the surface of a polymer such as PET is treated with plasma or electron beams to form radicals on the surface, and the active surface is then reacted with a monomer having a hydrophilic functional group, whereby a graft polymer surface layer, i.e., a surface layer having hydrophilic groups is obtained.

In addition to the above-described method, the photo graft polymerization can be conducted according to methods described in JP-A-53-17407 and JP-A-2000-212313. Specifically, a photo-polymerizable composition is coated on a surface of film substrate, and the coating is irradiated with light while bringing an aqueous radically polymerizable compound into contact with the coating to form the surface layer having hydrophilic groups.

Hydrophilic Monomer

As the hydrophilic monomer useful for forming the hydrophilic graft polymer chains, there may be illustrated monomers having a positive charge such as ammonium or phosphonium and monomers having a negative charge or an acid group capable of being dissociated to form a negative charge such as a sulfonic acid group, a carboxyl group, a phosphoric acid group or a phosphonic acid group. In addition, there may be used hydrophilic monomers having a nonionic group such as a hydroxyl group, an amido group, a sulfonamido group, an alkoxy group or a cyano group. Specific examples of the hydrophilic monomer particularly useful in the invention include the following monomers: (meth) acrylic acid or the alkali metal salts and the amine salts thereof; itaconic acid or the alkali metal salts and the amine salts thereof; allylamine or the hydrohalogenic acid salts thereof; 3-vinylpropionic acid or the alkali metal salts and the amine salts thereof; vinylsulfonic acid or the alkali metal salts and the amine salts thereof; vinylstyrenesulfonic acid or the alkali metal salts and the amine salts thereof; 2-sulfoethylene (meth)acrylate, 3-sulfopropylene (meth) acrylate or the alkali metal salts and the amine salts thereof; 2-acrylamido-2-methylpropanesulfonic acid or the alkali metal salts and the amine salts thereof; acid phosphoxypolyoxyethylene glycol mono (meth) acrylate, allylamine or the hydrohalogenic acid salt thereof, and 2-trimethylaminoethyl (meth)acrylate or the hydrohalogenic acid salt thereof. In addition, 2-hydroxyethyl (meth) acrylate, (meth)acrylamide, N-monomethylol (meth)acrylamide, N-dimethylol (meth) acrylamide, N-vinylpyrrolidone, N-vinylacetamide, allylamine or the hydrohalogenic acid salt thereof and polyoxyethylene glycol mono (meth) acrylate are also useful.

Method for Forming Hydrophilic Graft Chain-Introduced Crosslinked Hydrophilic Layer The crosslinked hydrophilic layer of the invention into which the hydrophilic graft chains are introduced can be ordinarily prepared by synthesizing a graft polymer according to a method known as a method for synthesizing a graft polymer, and then conducting crosslinking. Specifically, synthesis of the graft polymer is described in Fumio Ide, "Graft Jugo to Sono Oyo (Graft Polymerization and its Application)", Kobunshi Kankokai (1977) and "Shin-Kobunshi Jikkengaku 2, Kobunshi No Gosei.Hanno (New Polymer Experimantation 2, Stnthesis and Reaction of Polymer)" compiled by Kobunshi Gakkai, Kyoritsu Shuppan Co., Ltd. (1995).

Methods for synthesizing a graft polymer are fundamentally classified into three types: 1. a type of polymerizing a branch monomer from a backbone polymer; 2. a type of bonding a branch polymer to a backbone polymer; and a type of copolymerizing a branch polymer with a monomer for a backbone polymer (macromer method).

Of these three types, any one may be employed to prepare the hydrophilic surface of the invention, and the macromer method (3) is excellent in view of production suitability and control of film structure.

Synthesis of a graft polymer using a macromer is described in "Shin-Kobunshi Jikkengaku 2, Kobunshi No Gosei.Hanno (New Polymer Experimantation 2, Stnthesis and Reaction of Polymer)" compiled by Kobunshi Gakkai, Kyoritsu Shuppan Co., Ltd. (1995). It is also described in Yuya Yamashita, "Macromonomer no Kagaku to Kogyo (Chemistry and Industry of Macromonomer)", IPC, Ltd. (1989). Specifically, a hydrophilic macromer can be synthesized according to the method described in the literature using a hydrophilic monomer described above, for example, acrylic acid, acrylamide, 2-acrylamido-2-methylpropanesulfonic acid or N-vinylacetamide.

Of the hydrophilic macromers used in the invention, macromers derived from a carboxyl group-containing monomer such as acrylic acid or methacrylic acid, sulfonic acid macromers derived from 2-acrylamido-2-methylpropanesulfonic acid, vinylstyrenesulfonic acid or the salt thereof, amide macromers derived from acrylamide or methacrylamide, amide macromers derived from an N-vinylcarboxylic acid amide monomer such as N-vinylacetamide or N-vinylformamide, macromers derived from a hydroxyl group-containing monomer such as hydroxyethyl methacrylate, hydroxyethyl acrylate or glycerol monomethacrylate, and macromers derived from an alkoxy group- or ethylene oxide group-containing monomer such as methoxyethyl acrylate, methoxypolyethylene glycol acrylate or polyethylene glycol acrylate are particularly useful. In addition, monomers having a polyethylene glycol chain or a polypropylene glycol chain are also usable as the macromers in the invention.

A molecular weight of the macromer is ordinarily from 400 to 100,000, preferably 1,000 to 50,000, and more preferably 1,500 to 20,000. Macromers having a molecular weight of less than 400 fail to exhibit satisfactory effects, whereas macromers having a molecular weight of more than 100,000 have a poor polymerizing property with copolymerizable monomers which are used to form the backbone chain.

The hydrophilic macromer is copolymerized with other monomer having a reactive functional group to synthesize a graft copolymer. A composition containing a graft copolymer and a crosslinking agent capable of reacting with the functional group of the graft polymer is coated on a support and heated to cause a crosslinking reaction, thereby preparing a crosslinked hydrophilic layer having the hydrophilic graft chains introduced. Alternatively, the crosslinked hydrophilic layer can be prepared by synthesizing a graft polymer having the hydrophilic macromer and a photo-crosslinkable group or a photo-polymerizable group, coating the graft polymer on a support, and irradiating with light to cause a crosslinking reaction.

Thus, the hydrophilic surface in which the hydrophilic graft polymer chains exist can be provided on the support. A thickness of the hydrophilic surface-forming layer can be appropriately determined depending upon the end-use and, in general, the thickness is preferably in the range of from 0.001 $\mu$m to 10 $\mu$m, more preferably 0.01 $\mu$m to 5 $\mu$m, and still more preferably 0.1 $\mu$m to 2 $\mu$m. In case where the thickness is too small, scratching resistance tends to decrease whereas, in case where the thickness is too large, ink-repelling properties tend to be deteriorated.

In the lithographic printing plate precursor of the invention, a heat-sensitive layer described below is provided on the hydrophilic surface of the support.

(B) Heat-Sensitive Layer

The heat-sensitive layer of the invention contains at least either of a fine particulate polymer and microcapsules. It is preferred that the fine particulate polymer is a thermoplastic fine particulate polymer or a fine particulate polymer having a heat-reactive functional group, or the microcapsules are microcapsules containing in the inside a compound having a heat-reactive functional group. In particular, it is preferred that the tine particulate polymer is a thermoplastic fine particulate polymer having a functional group capable of mutually acting with the hydrophilic graft polymer, or the microcapsules are microcapsules containing in the inside a compound having a functional group capable of mutually acting with the hydrophilic graft polymer. By using such fine particulate polymer or microcapsules, adhesion between the heat-sensitive layer and the support is more increased and the printing durability is more improved without damaging the on press developability.

As the thermoplastic fine particulate polymer, those described, for example, in "Research Disclosure", No. 33303 (January 1992), JP-A-9-123387, JP-A-9-131850, JP-A-9-171249, JP-A-9-171250 and European Patent 931647 are preferably used. Specific examples thereof include homopolymers or copolymers of monomers, for example, ethylene, styrene, vinyl chloride, methyl acrylate, ethyl acrylate, methyl methacrylate, ethyl methacrylate, vinylidene chloride, acrylonitrile and vinylcarbazole, and a mixture of the homopolymers and/or the copolymers. Polystyrene and polymethyl methacrylate are more preferred.

The fine particulate polymers having a heat-reactive functional group and the microcapsules containing in the inside a compound having a heat-reactive functional group are more preferred.

Examples of the heat-reactive functional group include an ethylenically unsaturated group capable of causing a polymerization reaction (e.g., acryloyl group, methacryloyl group, vinyl group or allyl group); an isocyanate group capable of causing an addition reaction, or a blocked derivative thereof and a functional group having an active hydrogen atom, which is a reactant with the isocyanate group or the blocked derivative thereof (e.g., amino group, hydroxyl group or carboxyl group); an epoxy group causing an addition reaction and an amino group, a carboxyl group or a hydroxyl group, which is a reactant with the epoxy group; a carboxyl group and a hydroxyl group or an amino group, which cause a condensation reaction; and an acid anhydride group and an amino group or a hydroxyl group, which cause a ring-opening addition reaction. However, any functional group may be employed as far as the group can form a chemical bond.

As the fine particulate polymer having a heat-reactive functional group used in the heat-sensitive layer of the invention, those polymers having an acryloyl group, a methacryloyl group, a vinyl group, an allyl group, an epoxy group, an amino group, a carboxyl group, an isocyanate group, an acid anhydride group or the protected group thereof. Introduction of the functional group into the polymer particles may be conducted upon polymerization or by utilizing a polymer reaction after polymerization.

In the case of introducing upon polymerization, it is preferred to subject a monomer having the heat-reactive functional group, if desired, together with a monomer not having the heat-reactive functional group to emulsion polymerization or suspension polymerization.

Specific examples of the monomer having such a functional group include allyl methacrylate, allyl acrylate, vinyl methacrylate, vinyl acrylate, glycidyl methacrylate, glycidyl acrylate, 2-isocyanatoethyl methacrylate or the alcohol-blocked derivative thereof, 2-isocyanatoethyl acrylate or the alcohol-blocked derivative thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bi-functional acrylate and bi-functional methacrylate. However, the monomer is not limited thereto.

Examples of the monomer copolymerizable with such a monomer and having no heat-reactive functional group include, for example, styrene, an alkyl acrylate, an alkyl methacrylate, acrylonitrile and vinyl acetate. However, the monomer is not limited thereto and any monomer having no heat-reactive functional group may be used.

The polymer reaction employed in the case of introducing the heat-reactive functional group after polymerization includes polymer reactions described, for example, in WO 96-34316.

Thermoplastic Fine Particulate Polymer Having Functional Group Capable of Mutually Acting with Graft Polymer The term "mutual action" necessary for strongly bonding the thermally fused polymer with the support as used in the invention means and includes a conjugated bond, an ion bond, a hydrogen bond, a polar mutual action and a van der Waals mutual action.

In the invention, an ion bond or a hydrogen bond, which can form a strong bond (mutual action) without applying a particular energy such as heat, is particularly preferred in view of increasing sensitivity.

Specific examples of the functional group capable of mutually acting with the hydrophilic graft polymer include a basic functional group such as an amino group or a pyridyl group; a quaternary ammonium group; a hydroxyl group; an acidic functional group such as a carboxyl group or a sulfonic acid group; and a hydrogen bond-forming functional group such as an amido group.

The selection of appropriate functional group is conducted taking the kind of functional group of the graft polymer existing on the hydrophilic surface into consideration. Specifically, it is desired to select in view of ease of forming the mutual action with the graft polymer and the strength of mutual action formed. For example, in the case where the graft polymer is an acrylic acid graft polymer, it is preferred to select a functional group capable of mutually acting with acrylic acid, specifically an amino group, a pyridyl group, a quaternary ammonium group or an amido group, as the functional group to be introduced into the heat-sensitive layer-forming polymer. Also, in the case where the graft polymer is an acrylamide graft polymer, it is preferred to select a carboxyl group capable of mutually acting with acrylamide as the functional group to be introduced into the heat-sensitive layer-forming polymer.

The fine particulate polymer having a functional group capable of mutually acting with the graft polymer used in the invention includes those prepared by copolymerizing the thermoplastic fine particle-forming monomer with a monomer having a functional group capable of mutually acting with the graft polymer. In addition, a homopolymer of a monomer having a functional group capable of mutually acting with the graft polymer may also be used. In view of easy control of a thermally fusing temperature, however, the copolymer is more preferably used.

Examples of the monomer having a functional group capable of mutually acting with the hydrophilic graft polymer used in the invention include monomers having an amino group or a quaternary ammonium group such as 2-diethylaminoethylacrylic acid, 2-dimethylaminoethylacrylic acid, 2-diethylaminoethylmethacrylic acid, 2-dimethylaminoethylmethacrylic acid, 2-triethylammoniumethylacrylic acid, 2-trimethylammoniumethylacrylic acid, 2-triethylammoniumethylmethacrylic acid, 2-trimethylammoniumethylacrylic acid, dimethylaminomethylstyrene, tetramethylammoniummethylstyrene, diethylaminomethylstyrene and tetraethylammoniummethylstyrene; amide monomers such as acrylamide, N-vinylpyrrolidone and N-vinylacetamide; carboxylic acid monomers such as acrylic acid and methacrylic acid; hydroxyl group-containing monomers such as 2-hydroxyethylmethacrylate; and sulfonic acid group-containing monomers such as styrenesulfonic acid.

Introduction of the functional group into the fine polymer particles may be conducted upon polymerization or by utilizing a polymer reaction after polymerization.

In the case of introducing upon polymerization, it is preferred to conduct emulsion polymerization or suspension polymerization of the monomer having the functional group.

Examples of the monomer copolymerizable with such a monomer and having no mutually acting functional group include, for example, styrene, an alkyl acrylate, an alkyl methacrylate, acrylonitrile and vinyl acetate. However, the monomer is not limited thereto and any monomer that does not have the mutually acting functional group may be used.

The polymer reaction employed in the case of introducing the heat-reactive functional group after polymerization includes polymer reactions described, for example, in WO 96-34316.

Of the thermoplastic fine particulate polymers used in the heat-sensitive layer of the invention, those which can be easily fused are preferred in view of the image-forming property. Further, in view of the on press developability, those whose surface is hydrophilic and which can be dispersed in water are particularly preferred.

As a guide of the hydrophilicity of the fine particulate polymer surface, it is preferred that a contact angle (water droplet in the air) of a thin film prepared by coating only the fine particulate polymer and drying at a temperature lower than the heat-fusing temperature of polymer is smaller than a contact angle (water droplet in the air) of a thin film prepared by drying at a temperature higher than the heat-fusing temperature. In order to make the hydrophilicity of the fine particulate polymer to be in such a preferred state, a method of adsorbing a hydrophilic polymer or oligomer such as polyvinyl alcohol or polyethylene glycol, or a hydrophilic low molecular compound onto the surface of the fine particulate polymer is used. However, the method for imparting hydrophilicity to the fine particles is not limited thereto, and various known methods for imparting hydrophilicity to surface may be applied.

The heat-fusing temperature of fine particulate polymer is preferably 70° C. or higher, and more preferably 80° C. or higher in view of preservation stability. However, too much high heat-fusing temperature is not preferred in view of sensitivity, and hence the heat-fusing temperature is preferably from 80 to 250° C., and more preferably from 100 to 150° C.

An average particle size of the fine particulate polymer is preferably from 0.01 to 20 μm, more preferably from 0.05 to 2.0 μm, and optimally 0.1 to 1.0 μm. in case where the average particle size is too large, the resolving power tends to be deteriorated, whereas it is too small, the preservation stability may be deteriorated.

The fine particulate polymer is added in an amount of preferably from 50 to 98% by weight, more preferably from 60 to 95% by weight, based on the weight of the solid content of the heat-sensitive layer.

Microcapsules

In a preferred embodiment of the microcapsules used in the invention, the microcapsules contain in the inside a compound having a heat-reactive functional group. The compound having a heat-reactive functional group includes compounds having at least one heat-reactive functional group. Examples of the heat-reactive functional group include those described with respect to the fine particulate polymer above.

The compound having the polymerizable unsaturated group includes preferably compounds having at least one ethylenically unsaturated bond such as an acryloyl group, a methacryloyl group, a vinyl group or an allyl group, and more preferably compounds having two or more thereof. Such compounds are well known in the art and may be used in the invention without particular limitations. The chemical form thereof includes a monomer, a prepolymer, e.g., a dimer, a trimer or an oligomer, a copolymer thereof and a mixture thereof.

Examples thereof include an unsaturated carboxylic acid (e.g., acrylic acid, methacrylic acid, itaconic acid, crotonic acid, isocrotonic acid and maleic acid), an ester thereof and an amide thereof. An ester between an unsaturated carboxylic acid and an aliphatic polyhydric alcohol and an amide between an unsaturated carboxylic acid and an aliphatic polyamine are preferred.

Also, an addition reaction product of an unsaturated carboxylic acid ester or unsaturated carboxylic amide having a nucleophilic substituent such as a hydroxyl group, an amino group or a mercapto group with a mono- or poly-functional isocyanate or epoxide; and a dehydration condensation reaction product of an unsaturated carboxylic acid ester or unsaturated carboxylic amide having a nucleophilic substituent with a mono- or poly-functional carboxylic acid are preferably used.

In addition, an addition reaction product of an unsaturated carboxylic acid ester or amide having an electrophilic group such as an isocyanate group or an epoxy group with a mono- or poly-functional alcohol, amine or thiol, and a substitution reaction product of an unsaturated carboxylic acid ester or amide having a releasable substituent such as a halogen atom or a tosyloxy group and a mono- or poly-functional alcohol, amine or thiol are preferred.

Moreover, compounds obtained by replacing the above-described unsaturated carboxylic acid by an unsaturated phosphonic acid or chloromethylstyrene are also preferred.

Specific examples of the polymerizable compound of an ester between an unsaturated carboxylic acid and an aliphatic polyhydric alcohol include, an acrylic ester, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythrirol pentaacrylate, dipentaerythritol hexaacrylate, sorbitol triacrylate, sorbitol tetraacrylate, sorbitol pentaacrylate, sorbitol hexaacrylate, tris (acryloyloxyethyl) isocyanurate and a polyester acrylate oligomer; a methacrylic ester, e.g., tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythtirol hexamethacrylate, sorbitol trimethacrylate, sorbitol tetramethacrylate, bis[p-(3-methacryloyloxy-2-hydroxypropoxy)phenyl]dimethylmethane and bis-[p-(methacryloyloxyethoxy)phenyl]dimethylmethane; an itaconic ester, e.g., ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; a crotonic ester, e.g., ethylene glycol dicrotonate, tetramethylene glycol dicrotonate, pentaerythritol dicrotonate and sorbitol tetradicrotonate; an isocrotonic ester, e.g., ethylene glycol diisocrotonate, pentaerythritol diisocrotonate and sorbitol tetraisocrotonate; and a maleic ester, e.g. ethylene glycol dimaleate, triethylene glycol dimaleate, pentaerythritol dimaleate and sorbitol tetramaleate.

Other examples of the ester include, for example, aliphatic alcohol esters described in JP-B-46-27926 (the term "JP-B" as used herein means an "examined Japanese patent publication"), JP-B-51-47334 and JP-A-57-196231, those having an aromatic skeleton described in JP-A-59-5240, JP-A-59-5241 and JP-A-2-226149, and those having an amino group described in JP-A-1-165613.

Specific examples of the monomer of an amide between an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylylenebisacrylamide and xylylenebismethacrylamide.

Other preferred examples of amide monomer include those having a cyclohexylene structure described in JP-B-54-21726.

In addition, urethane addition-polymerizable compounds produced by using an addition reaction between an isocyanate and a hydroxyl group are preferred. Specific examples thereof include urethane compounds having two or more polymerizable unsaturated groups per molecule and obtained by adding a hydroxyl group-containing unsaturated monomer represented by formula (I) described below to a polyisocyanate compound having two or more isocyanate groups per molecule described in JP-B-48-41708.

$$CH_2{=}C(R^1)COOCH_2CH(R^2)OH \qquad (I)$$

(wherein $R^1$ and $R^2$ each represent H or $CH_3$)

Urethane acrylates described in JP-A-51-37193, JP-B-2-32293 and JP-B-2-16765 and urethane compounds having an ethylene oxide-containing skeleton described in JP-B-58-49860, JP-B-56-17654, JP-B-62-39417 are JP-B-62-39418 are also preferred.

Further, radical polymerizable compounds having an amino structure or a sulfide structure in their molecules described in JP-A-63-277653, JP-A-63-260909 and JP-A-1-105238 are preferred.

Other preferred examples include polyester acrylates described in JP-A-48-64183, JP-B-49-43191 and JP-B-52-30490, and polyfunctional acrylates or methacrylates such as epoxyacrylates obtained by reacting an epoxy resin with (meth)acrylic acid. Also, specific unsaturated compounds described in JP-B-46-43946, JP-A-1-40337 and JP-A-1-40336 and vinylphosphonic acid compounds described in JP-A-2-25493 are preferred. In some cases, perfluoroalkyl group-containing compounds described in JP-A-61-22048 are also preferably used. Further, photocurable monomers and oligomers described in Nippon Secchaku Kyokaishi, vol. 20, No. 7, pages 300 to 308 (1984) may also be preferably used.

Preferred examples of the epoxy compound include glycerin polyglycidyl ether, polyethylene glycol diglycidyl ether, polypropylene glycol diglycidyl ether, trimethylolpropane polyglycidyl ether, sorbitol polyglycidyl ether, and polyglycidyl ethers of bisphenols or polyphenols or the hydrogenated products thereof.

Preferred examples of the isocyanate compound include tolylene diisocyanate, diphenylmethane diisocyanate, polymethylenepolyphenylpolyisocyanate, xylylene diisocyanate, naphthalene diisocyanate, cyclohexanephenylene diisocyanate, isophorone diisocyanate, hexamethylene diisocyanate, cyclohexylene diisocyanate, and alcohol- or amine-blocked compounds thereof.

Preferred examples of the amine compound include ethylenediamine, diethylenetriamine, triethylenetetramine, hexamethylenediamine, propylenediamine and polyethyleneimine.

Preferred examples of the hydroxyl group-containing compound include compounds having a terminal methylol group, polyhydric alcohols such as pentaerythritol, bisphenols and polyphenols.

Preferred examples of the carboxyl group-containing compound include aromatic polycarboxylic acids such as pyromellitic acid, trimellitic acid and phthalic acid, and aliphatic polycarboxylic acids such as adipic acid.

Preferred examples of the acid anhydride include pyromellitic acid anhydride and benzophenonetetracarboxylic acid anhydride.

Preferred examples of the copolymer of ethylenically unsaturated compound include allyl methacrylate copolymers, for example, an allyl methacrylate/methacrylic acid copolymer, an allyl methacrylate/ethyl methacrylate copolymer and an allyl methacrylate/butyl methacrylate copolymer.

The microcapsules may or may not be fused by heat. What is important is that, of the materials contained within the microcapsules, the material that has exuded on the microcapsule surface or out of the microcapsule or the material that has penetrated into the microcapsule wall during the coating procedure can cause a chemical reaction by heat. Such materials may react with the hydrophilic resin added or the low molecular compound added. Alternatively, materials having different functional groups capable of thermally reacting with each other are separately incorporated into two or more different kinds of microcapsules and they are reacted with each other. It is preferred for the microcapsules to be fused by heat in view of image formation, though not necessarily.

In a more preferred embodiment of the microcapsules used in the invention, the microcapsules contain a compound having a functional group capable of mutually acting with the hydrophilic graft polymer. Chemical form of the compound having the functional group capable of mutually acting with the hydrophilic graft polymer includes a monomer, a prepolymer, e.g., a dimer, a trimer or an oligomer, a copolymer thereof, and a mixture thereof.

Specific examples of the compound having the functional group capable of mutually acting with the hydrophilic graft polymer include the polymers having at least one reactive functional group described with respect to the thermoplastic fine particulate polymer above and, in addition, the low molecular compounds having the reactive functional group described hereinbefore. Of these, it is preferred to use the polymer having the functional group capable of mutually acting with the hydrophilic graft in view of the heat-fusing property.

In this embodiment, it suffices that the microcapsule-forming materials, the compound contained therein, and other arbitrary components existing in the heat-sensitive layer in which the microcapsules are dispersed react to form image areas, i.e., hydrophobic areas (ink-receptive areas). For example, there are illustrated a type of microcapsules which are fused by heat, a type of microcapsules in which, of the materials contained within the microcapsules, the material that has exuded on the microcapsule surface or out of the microcapsules or the material that has penetrated into the microcapsule wall during the coating procedure can cause a chemical reaction by heat, a type of microcapsules in which the microcapsule-forming materials or the compounds contained therein react with the hydrophilic resin added or the low molecular compound added, and a type of a combination of two or more microcapsules in which two or more different kinds of microcapsule wall materials or the materials retained therein, having different thermally reactive functional groups, respectively are designed to be thermally reacted with each other, so as to react the microcapsules with each other.

As in this embodiment, by encapsulating the compound having the functional group capable of mutually acting with the hydrophilic graft polymer in the microcapsules, the compound capable of mutually acting with the hydrophilic surface is isolated with the microcapsule wall, whereby undesirable mutual action of the compound with the support surface can be prevented. Specifically, since the image-forming compound is contained in the microcapsules and isolated from the support surface before heating or in the unheated areas, the occurrence of stains and the decrease in removability due to mutual action between the image-forming compound and the hydrophilic graft polymer on the hydrophilic surface are prevented in the non-image areas (unheated areas), thus the stain-preventing effect in the non-image areas and the on press developability are more improved.

In order to encapsulate the compound having the functional group described above to prepare microcapsules, known microencapsulating methods are utilized. Methods for producing microcapsules include, for example, a method utilizing coacervation as described in U.S. Pat. No. 2,800,457, a method of interfacial polymerization as described in British Patent 990,443, U.S. Pat. No. 3,287,154, JP-B-38-19574, JP-B-42-446 and JP-B-42-711, a method of depositing a polymer as described in U.S. Pat. Nos. 3,418,250 and 3,660,304, a method of using an isocyanate polyol wall material as described in U.S. Pat. No. 3,796,669, a method of using an isocyanate wall material as described in U.S. Pat. No. 3,914,511, a method of using a urea-formaldehyde or urea-formaldehyde-resorcinol wall-forming material as described in U.S. Pat. Nos. 4,001,140, 4,087,376 and 4,089,802, a method of using a melamine-formaldehyde resin or hydroxycellulose as a wall material as described in U.S. Pat. No. 4,025,455, an in situ method by polymerization of a monomer as described in JP-B-36-9163 and JP-B-51-9079/1976, a spray-drying method as described in British Patent 930,422 and U.S. Pat. No. 3,111,407, and an electrolytic dispersion cooling method. However, the production methods of microcapsules in the invention are not limited thereto.

The preferred microcapsule wall used in the invention has a three dimensional crosslinkage and a property of swelling with a solvent. From such a viewpoint, polyurea, polyurethane, polyester, polycarbonate, polyamide, and a mixture thereof are preferably used as the wall material of microcapsule. Polyurea and polyurethane are particularly preferred. A compound having the heat-reactive functional group may be introduced into the microcapsule wall.

An average particle size of the microcapsules is preferably from 0.01 to 20 $\mu$m, more preferably from 0.05 to 2.0

$\mu$m, still more preferably from 0.10 to 1.0 $\mu$m. In case where the average particle size is too large, the resolving power tends to be deteriorated, whereas it is too small, the preservation stability may be deteriorated.

An amount of the microcapsules added to the heat-sensitive layer is preferably from 50 to 98% by weight, more preferably from 60 to 95% by weight, in terms of solid content. In such a range, the good on press developability and, at the same time, the excellent sensitivity and printing durability are obtained.

In the preparation of a coating solution for the heat-sensitive layer containing the microcapsules, a solvent which can dissolve the materials contained in the inside of the microcapsules and can swell the wall material may be added to a dispersion medium for the microcapsules. Such a solvent accelerates diffusion of the compound having a heat-reactive functional group contained in the microcapsules to the outside of the microcapsules.

An appropriate solvent may be easily selected from many commercially available solvents taking the kind of dispersing medium for microcapsule, properties of the microcapsule wall, wall thickness and the materials contained therein into consideration. For example, in case of water-dispersible microcapsules comprising a crosslinked polyurea or polyurethane wall, alcohols, ethers, acetals, esters, ketones, polyhydric alcohols, amides, amines and fatty acids are preferably used.

Specific examples of the solvent include methanol, ethanol, tertiarybutanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide. However, the solvent is not limited thereto. The solvents may be used as a mixture of two or more thereof.

A solvent that is insoluble in the microcapsule dispersion but becomes soluble by the addition of the above-described solvent may also be used.

Other Components

In the heat-sensitive layer of the invention, various additives may further be used in addition to the image-forming fine particulate polymer or microcapsules.

<Hydrophilic Resin>

A hydrophilic resin may be added to the heat-sensitive layer of the invention. By adding the hydrophilic resin, not only the on press developability but also film strength of the heat-sensitive layer itself are improved.

Preferred examples of the hydrophilic resin include resins having a hydrophilic group, for example, hydroxyl, carboxyl, hydroxyethyl, hydroxypropyl, amino, aminoethyl, aminopropyl and carboxymethyl.

Specific examples of the hydrophilic resin include arabic gum, casein, gelatin, starch derivatives, carboxymethyl cellulose and the sodium salt thereof, cellulose acetate, sodium alginate, vinylacetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60% by weight, preferably at least 80% by weight, polyvinyl formal, polyvinyl butyral, polyvinylpyrrolidone, homopolymers and copolymers of acrylamide, homopolymers and copolymers of methacrylamide and homopolymers and copolymers of N-methylolacrylamide.

An amount of the hydrophilic resin added to the heat-sensitive layer is preferably from 5 to 40% by weight, more preferably from 20 to 30% by weight, based on the solid content in the heat-sensitive layer. In such a range, the good on press developability and film strength are obtained.

<Light-Heat Converting Agent>

In the case of forming an image on the lithographic printing plate precursor of the invention by scanning exposure with a laser beam, it is preferred to incorporate into the lithographic printing plate precursor a light-heat converting agent for converting light energy to heat energy.

The light-heat converting agent used in the lithographic printing plate precursor of the invention includes any substance that can absorb light such as UV ray, visible light, infrared ray or white light and convert it to heat. Examples of such substance include carbon black, carbon graphite, a pigment, a phthalocyanine dye, metal powder or metal compound powder. Dyes or pigments capable of effectively absorbing infrared ray of from 760 nm to 1,200 nm in wavelength, metal powder and metal compound powder are particularly preferred.

Examples of the dye include commercially available dyes and known dyes described in literature, for example, "Senryo Binran (Dye Handbook)" compiled by Yuki Gosei Kagaku Kyokai (1970). Specifically, the dyes include azo dyes, metal complex azo dyes, pyrazolone azo dyes, anthraquinone dyes, phthalocyanine dyes, carbonium dyes, quinoneimine dyes, methine dyes, cyanine dyes and metal-thiolate complexes. Preferred examples thereof include cyanine dyes described in JP-A-58-125246, JP-A-59-84356, JP-A-59-202829 and JP-A-60-78787; methine dyes described in JP-A-58-173696, JP-A-58-181690 and JP-A-58-194595; naphthoquinone dyes described in JP-A-58-112793, JP-A-58-224793, JP-A-59-48187, JP-A-59-73996, JP-A-60-52940 and JP-A-60-63744; squalirium dyes described in JP-A-58-112792; and cyanine dyes described in British Patent 434,875.

Also, near infrared ray-absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84294, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used.

Other preferred examples of the dye include near infrared absorbing dyes represented by formulae (I) and (II) in U.S. Pat. No. 4,756,993.

Of these dyes, cyanine dyes, squalirium dyes, pyrylium dyes and nickel thiolate complexes are particularly preferred.

Examples of the pigment used as the light-heat converting agent in the invention include commercially available pigments and pigments described in Color Index (C.I.), "Saishin Ganryo Binran (Handbook of the Newest Pigments)", compiled by Pigment Technology Society of Japan (1977), "Saishin Ganryo Oyou Gijutsu (Newest Application on Techniques for Pigments)", CMC Shuppan (1986) and "Insatsu Ink Gijutsu (Printing Ink Technology)", CMC Shuppan (1984).

Examples of pigment kinds include black pigments, yellow pigments, orange pigments, brown pigments, red pigments, purple pigments, blue pigments, green pigments, fluorescent pigments, metal powder pigments and polymer-bonded pigments. Specific examples of usable pigments include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, lake pigments, azine pigments, nitroso pigments, natural pigments, fluorescent pigments, inorganic pigments, and carbon black. Of these pigments, carbon black is preferred.

Fine metal particles may also be used as the light-heat converting agent in the heat-sensitive layer of the invention. The fine metal particles may be any fine metal particles that can be thermally fused by irradiation with light due to their light-heat converting properties. Fine particles of metal selected from Group 8 and Group 1B or the alloy thereof are preferably used. Fine particles of Ag, Au, Cu, Pt, Pd, or the alloy thereof are particularly preferred.

An average particle size of the fine metal particles usable in the invention is preferably from 1 to 500 nm, more preferably from 1 to 100 nm, and particularly preferably from 1 to 50 nm. As to degree of dispersion, while the particles may be of a polydisperse system, a monodisperse system having a coefficient of variation of 30% or less is preferred.

The pigment or dye may be added as the light-heat converting agent to the heat-sensitive layer of the invention in an amount of up to 30% by weight, preferably from 1 to 25% by weight, and particularly preferably 7 to 20% by weight, based on the total weight of solid content in the heat-sensitive layer.

The fine metal particles are used as the light-heat converting agent in an amount of from about 5 to about 50% by weight, preferably from 10 to 30% by weight, and particularly preferably from 15 to 20% by weight, based on the total weight of solid content in the image-forming material. In such a range, a good sensitivity-improving effect is obtained.

<Other Additives>

To the heat-sensitive layer of the invention may further be added, if desired, various compounds in addition to the above-described components. For example, in order to more improve printing durability, a multi-functional monomer may be added to the heat-sensitive layer matrix. The poly-functional monomer includes the monomers capable of being encapsulated in the microcapsules described above. A particularly preferred monomer is trimethylolpropane triacrylate.

Also, a dye having a large absorption in a visible region may be used as a colorant for the image in order to easily distinguish the image areas from non-image areas after the formation of image. Specific examples of the dye include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries, Ltd.), Victoria Pure Blue, Crystal Violet (CI 42555), Methyl Violet (CI 42535), Ethyl Violet, Rhodamine B (CI 45170B), Malachite Green (CI 42000), Methylene Blue (CI 52015), and dyes described in JP-A-62-293247. In addition, pigments such as phthalocyanine pigments, azo pigments and titanium oxide may also be preferably used. The amount of such dye or pigment is from 0.01 to 10% by weight based on the total weight of solid content in a coating solution for the heat-sensitive layer.

In the case of using the fine particulate polymer or the microcapsules having the heat-reactive group in the heat-sensitive layer of the invention, a compound which initiates or accelerates the reaction may be added, if desired. The compound which initiates or accelerates the reaction includes a compound which generates a radical or a cation with heat. The compound includes, for example, lophine dimer, a trihalometyl compound, a peroxide, an azo compound, an onion salt including a diazonium salt and a diphenyliodonium salt, an acylphosphine and an imidosulfonato.

The compound may be added in an amount of from 1 to 20% by weight, preferably from 3 to 10% by weight, based on the solid content of the heat-sensitive layer.

In the invention, it is also preferred to add a small amount of a thermal polymerization inhibitor in order to prevent undesirable thermal polymerization of the ethylenically unsaturated compound during the preparation or storage of a coating solution for the heat-sensitive layer. Suitable examples of the thermal polymerization inhibitor includes hydroquinone, p-methoxyphnenol, di-t-butyl-p-cresol, pyrogallol, t-butylcatechol, benzoquinone, 4,4'-thiobis(3-methyl-6-t-butylphenol) 2,2'-methylenebis(4-methyl-6-t-butylphenol) and N-nitroso-N-phenylhydroxylamine aluminum salt. The thermal polymerization inhibitor is preferably added in an amount of from about 0.01 to about 5% by weight based on the solid content of the composition for the heat-sensitive layer.

In order to prevent polymerization inhibition due to oxygen, a higher fatty acid or the derivative thereof such as behenic acid or behenic amide may be added so as to localize on the surface of the heat-sensitive layer in the course of drying after the coating procedure, if desired. The higher fatty acid or the derivative thereof is preferably added in an amount of from about 0.1 to about 10% by weight based on the solid content of the heat-sensitive layer.

Further, a plasticizer may be added, if desired, to the heat-sensitive layer of the invention in order to impart flexibility to the coating film. For example, there are used polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

Formation Of Heat-Sensitive Layer

The heat-sensitive layer of the invention is formed by dissolving or dispersing the above-described components in a solvent to prepare a coating solution, then coating the coating solution on the hydrophilic surface of the support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. However, the solvent is not limited thereto. The solvents maybe used alone or as a mixture thereof. The coating solution preferably has a solid content concentration of from 1 to 50% by weight.

A coated amount of the heat-sensitive layer (solid content) on the support after drying may be varied depending upon the end use, but in general, it is preferably from 0.5 to 5.0 $g/m^2$. In case where the coated amount is less than the range, film properties of the heat-sensitive layer that functions to record an image are deteriorated, although apparent sensitivity increases. For the coating, various methods can be employed. For example, there are illustrated a bar coater coating method, a rotary coating method, a spray coating method, a curtain coating method, a dip coating method, an air knife coating method, a blade coating method and a roll coating method.

To the coating solution for heat-sensitive layer in accordance with the invention may be added a surfactant, for example, a fluorine-containing surfactant described in JP-A-62-170950 for improving coating properties. The surfactant is added preferably in an amount of from 0.01 to 1% by weight, more preferably from 0.05 to 0. 5% by weight, based on the total solid content of the heat-sensitive layer.

Other Constituents

<Overcoat Layer>

In the lithographic printing plate precursor of the invention, a water-soluble overcoat layer may be provided on the heat-sensitive layer in order to prevent the surface of heat-sensitive layer from being contaminated with an oleophilic substance. Such a water-soluble overcoat layer is preferably removable with ease upon printing and contains a resin selected from water-soluble organic high-molecular compounds.

The water-soluble organic high-molecular compound used has a film-forming ability to form a film upon coating and drying. Specific examples thereof include polyvinyl acetates (having a hydrolysis ratio of 65% or more), polyacrylic acid or the alkali metal salts or amine salts thereof, polyacrylic acid copolymers or the alkali metal salts or amine salts thereof, polymethacrylic acid or the alkali metal salts or amine salts thereof, polymethacrylic acid copolymers or the alkali metal salts or amine salts thereof, polyacrylamide or the copolymers thereof, polyhydroxyethyl acrylate, polyvinylpyrrolidone or the copolymers thereof, polyvinyl methyl ether, polyvinyl methyl ether/maleic anhydride copolymer, poly-2-acrylamido-2-methyl-1-propanesulfonic acid or the alkali metal salts or amine salts thereof, poly-2-acrylamido-2-methyl-1-propanesulfonic acid copolymers or the alkali metal salts or amine salts thereof, arabic gum, cellulose derivatives (e.g., carboxymethyl cellulose, carboxyethyl cellulose or methyl celllulose) or the modified products thereof, white dextrin, pullulan and enzyme-decomposed etherified dextrin. A mixture of two or more of these resins may be used depending upon the purpose.

The water-soluble light-heat converting agent described above maybe added to the overcoat layer, if desired. Further, in case of using an aqueous coating solution, a nonionic surfactant such as polyoxyethylene nonylphenyl ether or polyoxyethylene dodecyl ether may be added in order to secure uniform coating.

The overcoat layer is preferably coated in a dry coating amount of from 0.1 to 2.0 g/$m^2$. In such a range, the overcoat layer serves to effectively prevent the surface of heat-sensitive layer from being contaminated with an oleophilic substance such as fingerprint stain, without damaging the on press developability.

Support

The support for forming the hydrophilic surface comprising the hydrophilic graft polymer used in the invention is not particularly limited, and any material that is a dimensionally stable plate-like substance and has necessary flexibility, strength and durability may be used. For example, there are illustrated paper, paper laminated with a plastic (e.g., polyethylene terephthalate, polyethylene, polypropylene or polystyrene), a metal plate (e.g., an aluminum, zinc or copper plate), a plastic film (e.g., a film of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated or vapor-deposited with the metal described above. As the support of the invention, a polyester film or an aluminum plate is preferred.

<Surface Property of the Support>

In view of ease of forming the hydrophilic surface or adhesion to the heat-sensitive layer provided thereon, it is preferred to use a support having a roughened surface as the support for forming the hydrophilic surface comprising the graft polymer used in the invention. An example of preferred surface property of the support (solid surface) used in the invention is described below.

A preferred state of roughened surface of the support used in the invention is represented by the following two-dimensional roughness parameters, i.e., 0.1 to 1 $\mu$m in average centerline roughness (Ra), 1 to 10 $\mu$m in maximum height (Ry), 1 to 10 $\mu$m in average ten-point roughness (Rz), 5 to 80 $\mu$m in average space (Sm) between a peak and a valley, 5 to 80 $\mu$m in average space (S) between local peaks, 1 to 10 $\mu$m in maximum height (Rt), 1 to 10 $\mu$m in centerline peak height (Rp), or 1 to 10 $\mu$m in centerline valley depth (Rv). A surface satisfying one or more of these conditions is preferred, and a surface satisfying all of them is more preferred.

The above-described two-dimensional roughness parameters are defined as follows.

Average Centerline Roughness (Ra):

A value obtained by taking out a part of the roughness curve in a measuring length of L in the direction of the centerline, and calculating the arythmetic mean of the absolute values of deviation between the centerline of the taken-out part and the roughness curve.

Maximum Height (Ry):

A value obtained by taking out a part of the roughness curve in a standard length in the direction of the average line thereof, and measuring the space between the peak line and the valley line in the taken-out part in the direction of longitudinal magnification of the roughness curve.

Average Ten-Point Roughness (Rz):

A value obtained by taking out a part of the roughness curve in a standard length in the direction of the average line thereof, measuring heights of 5 peaks from the highest (Yp) and depths of 5 valleys from the lowest (Yv) in the direction of the longitudinal magnification from the average line of the taken-out part, calculating average values and a sum of the absolute values of the average values, and representing the sum in terms of micrometer ($\mu$m).

Average Space (Sm) Between a Peak and a Valley:

A value obtained by taking out a part of the roughness curve in a standard length in the direction of the average line thereof, determining the sum of average lines corresponding to one peak and an adjacent valley in the taken-out part, calculating the arythmetic mean of the spaces between many peaks and valleys, and representing the arythmetic mean in terms of Average Space (S) Between Localized Peaks:

A value obtained by taking out a part of the roughness curve in a standard length in the direction of the average line thereof, determining the length of an average line corresponding to distance between adjacent peaks in the taken-out part, calculating the arythmetic mean of many of the peak-to-peak spaces, and representing the arythmetic mean in terms of mm.

Maximum Height (Rt):

A value obtained by sandwiching a part of the roughness curve taken out in a standard length with two straight lines in parallel with the centerline, and determining the space between the two straight lines.

Centerline Peak Height (Rp):

A value obtained by taking out a part of the roughness curve in a length of L in the direction of the centerline thereof, and measuring the space between the centerline and the line in parallel with the centerline in this taken-out part and passing the highest peak.

Centerline Valley Depth (Rv):

A value obtained by taking out a part of the roughness curve in a length of L in the direction of the centerline thereof, and measuring the space between the centerline and the line in parallel with the centerline in this taken-out part and passing the deepest valley.

Plate Making and Printing

Image formation on the lithographic printing plate precursor of the invention is conducted by means of heat. Specifically, a direct imagewise recording technique using a thermal recording head, a technique of scanning exposure with an infrared ray, a technique of flash exposure of high illuminance such as a xenon discharge lamp, or a technique of exposure with an infrared ray lamp may be employed. Exposure with a semiconductor laser irradiating an infrared ray of from 700 to 1,200 nm in wavelength, and exposure with a solid high output infrared laser such as YAG laser are preferred.

The thus imagewise exposed lithographic printing plate precursor of the invention can be mounted on a printing press without any particular development processing to conduct printing using an ink and dampening water in a conventional manner. Specifically, unexposed areas of the exposed lithographic printing plate precursor is easily removed by an aqueous component contained in the dampening water in the initial stage of the printing to form non-image areas.

In addition, it is also possible to mount the lithographic printing plate precursor on a cylinder of a printing press, expose it by means of a laser installed in the printing press, then apply thereto dampening water and/or an ink to conduct the on press development as described in Japanese Patent No. 2938398.

Further, the lithographic printing plate precursor may be used to conduct printing after being subjected to development processing using water or an appropriate aqueous solution as a developing solution.

The invention will be described in greater detail with reference to the following examples, however, the invention should not be construed as being limited thereto.

<Preparation of Fine Particulate Polymer (I-1) Having Heat-Reactive Functional Group>

7.5 g of allyl methacrylate, 7.5 g of butyl methacrylate and 200 ml of an aqueous solution of polyoxyethylene nonylphenol (concentration: $9.84\times10^{-3}$ mol/liter) were added to a vessel, and the atmosphere within the vessel was replaced by nitrogen gas while stirring at 250 rpm. After adjusting the temperature of the solution at 25° C., 10 ml of an aqueous solution of cerium (IV) ammonium salt (concentration; $0.984\times10^{-3}$ mol/liter) was added thereto. At that time, pH was adjusted to 1.3 to 1.4 by adding an aqueous solution of ammonium nitrate (concentration: $58.8\times10^{-3}$ mol/liter). Then, the solution was stirred for 8 hours. The resulting solution had a solid content concentration of 9.5%, and an average particle size of the particulate polymer was 0.4 μm.

<Preparation of Microcapsule (I-1)>

40 g of xylene diisocyanate, 10 g of trimethylolpropane diacrylate, 10 g of allyl methacrylate/butyl methacrylate copolymer (molar ratio: 7/3) and 0.1 g of Pionin A41C (manufactured by Takemoto Oil & Fat Co., Ltd.) were dissolved in 60 g of ethyl acetate to prepare an oil phase component. As an aqueous phase components, 120 g of a 4% aqueous solution of PVA 205 (manufactured by Kuraray Co., Ltd.) was prepared. The oil phase component and the aqueous phase component were emulsified at 10,000 rpm using a homogenizer. Subsequently, 40 g of water was added thereto, followed by stirring at room temperature for 30 minutes, then at 40° C. for 3 hours. The resulting microcapsule solution had a solid content concentration of 20%, and an average particle size of the microcapsules was 0.5 μm.

<Preparation of Hydrophilic Supports I-1 and I-2>

A 188-μm thick, biaxially stretched polyethylene terephthalate film (A4100; manufactured by Toyobo Co., Ltd.) was subjected to an oxygen glow treatment using a flat plate magnetron sputtering apparatus (CFS-10-EP70; manufactured by Shibaura Eletec Corp.) under the following conditions.

Initial vacuum: $1.2\times10^{-3}$ Pa

Oxygen pressure: 0.9 Pa

RF glow: 1.5 KW

Treating time: 60 sec

Then, the glow-treated film was immersed in a 10% by weight aqueous solution of sodium styrenesulfonate for 7 hours at 70° C. under bubbling nitrogen gas therein. The film was washed with water for 8 hours to obtain a support (hydrophilic support I-1) having a graft chain of sodium styrenesulfonate on the surface thereof.

Also, the same procedure as described above was conducted except for changing sodium styrenesulfonate to acrylic acid to obtain a support (hydrophilic support I-2) having a graft chain of acrylic acid on the surface thereof.

The following coating solution for heat-sensitive layer (I-1) or (I-2) was coated on the hydrophilic support I-1 or I-2 and dried in an oven at 100° C. for 60 sec to prepare a heat-sensitive layer of 0.5 g/m$^2$ in a dry coated amount.

| Coating solution for heat-sensitive layer (I-1) | |
|---|---|
| Fine particulate polymer (I-1) | 5 g (as solid content) |
| Polyhydroxyethyl acrylate (weight average molecular weight: 25,000) | 0.5 g |
| IR ray-absorbing dye (IR-11) shown below | 0.3 g |
| Water | 100 g |

| Coating solution for heat-sensitive layer (I-2) | |
|---|---|
| Microcapsule (I-1) | 5 g (as solid content) |
| Trimethylolpropane triacrylate | 3 g |
| IR ray-absorbing dye (IR-11) shown below | 0.3 g |

-continued

| | |
|---|---|
| Water | 60 g |
| 1-Methoxy-2-propanol | 40 g |

(IR-11)

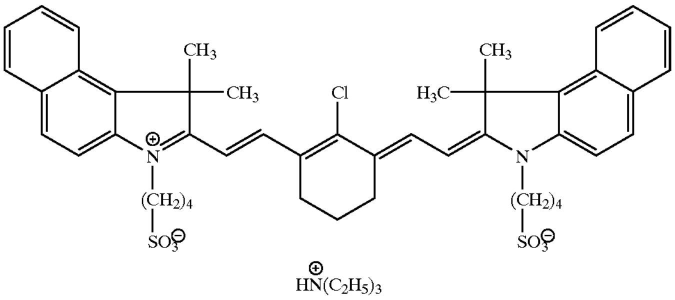

EXAMPLES I-1 to I-3

Lithographic printing plate precursors were prepared according to the combinations shown in Table I-1 below.

COMPARATIVE EXAMPLE I-1

A lithographic printing plate precursor was prepared in the same manner as in Example I-1 except for using the following aluminum support having a hydrophilic surface as the hydrophilic support.

An aluminum plate (JIS A1050; thickness: 0.24 mm) was electrolytically grained in a nitric acid bath, anodized in a sulfuric acid bath, and then treated with an aqueous silicate solution in a known manner. The resulting aluminum support had an Ra (centerline surface roughness) of 0.25 um, an anodic oxidization film in an amount of 2. 5g/m$^2$, and deposited silicon in an amount of 10 mg/m$^2$.

EXAMPLE I-4

A lithographic printing plate precursor was prepared in the same manner as in Example I-1 except for using a support (hydrophilic support I-3) having a crosslinked hydrophilic layer comprising a hydrophilic graft chain introduced according to the following manner.

<Synthesis of Hydrophilic Macromer: Amide Macromonomer>

30 g of acrylamide and 3.8 g of 3-mercaptopropionic acid were dissolved in 70 g of ethanol, and the solution was heated to 60° C. in a nitrogen atmosphere, followed by adding thereto 300 mg of AIBN to react for 6 hours. After the completion of the reaction, a white precipitate was collected by filtration and washed thoroughly with methanol to obtain 30.8 g of a carboxyl group-terminated prepolymer.

20 g of the resulting prepolymer was dissolved in 62 g of dimethylsulfoxide, and to the solution 6.71 g of glycidyl methacrylate, 504 mg of N,N-dimethyldodeylamine (catalyst) and 62.4 mg of hydroquinone (polymerization inhibitor) were added, followed by reacting at 140° C. for 7 hours in a nitrogen atmosphere. The reaction solution was added to acetone to precipitate a polymer. The polymer was thoroughly washed to obtain 23.4 g of a methacrylate-terminated acrylamide macromonomer (weight average molecular weight: 1,400).

<Synthesis of Graft Polymer (I-1) Using Hydrophilic Macromer>

An aqueous solution prepared by dissolving 4 g of the macromonomer described above, 6 g of methacrylic acid and 100 mg of potassium per sulfate in 17 g of distilled water was dropwise added to a flask containing 5 g of distilled water at 65° C. over a period of 2 hours in a nitrogen atmosphere. After the completion of the dropwise addition, heating was continued for 6 hours. The reaction solution was added to acetone to precipitate a polymer. The polymer was thoroughly washed to obtain 9.5 g of a methacrylic acid-graft-acrylamide polymer.

<Synthesis of Graft Polymer (I-1) Having Photo-Crosslinkable Group>

9 g of the graft polymer described above was dissolved in 200 g of DMAC, and to the solution 0.41 g of hydroquinone, 5 g of 2-methacryloyloxyethyl isocyanate, and 0.15 g of dibutyltin dilaurate were added, followed by reacting at 65° C. for 5 hours. After the completion of the reaction, the reaction solution was cooled, followed by adding 1 N sodium hydroxide aqueous solution to neutralize the carboxyl group. The neutralized solution was added to ethyl acetate to precipitate a polymer, followed by thoroughly washing to obtain the desired polymer (yield: 13 g).

<Preparation of a Crosslinked Hydrophilic Layer>

The following composition was coated on an aluminum plate in a dry coating amount of 1.7 g/m$^2$, dried at 100° C. for 2 minutes, and then exposed with UV ray to prepare a support having a crosslinked hydrophilic layer having the hydrophilic graft chain introduced (hydrophilic support I-3).

| | |
|---|---|
| Graft polymer (I-1) having photo-crosslinkable group (described above | 1.0 g |
| Photopolymerization initiator A (shown below) | 0.1 g |
| Distilled water stabilized with a surfactant (1.5% by weight based on the polymer) | 12.7 g |
| Acetonitrile | 6.4 g |

Photopolymerization initiator A

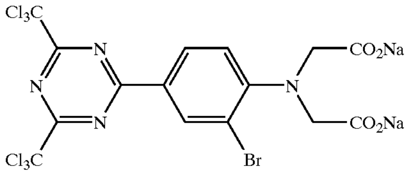

Each of the on press-developable lithographic printing plate precursors obtained in Examples I-1 to I-4 and Comparative Example I-1 was exposed using Trendsetter 3244VFS manufactured by Creo Inc. equipped with a water-cooling type 40W infrared semiconductor laser and, without any processing, mounted on a cylinder of a printing press SOR-M manufactured by Heidelberg Inc., followed by conducting printing with supplying dampening water, printing ink, and paper in this order.

An exposure amount necessary for forming an image (sensitivity) was determined with each of the printing plate precursors, and printing durability represented in terms of number of printed matter obtained by exposing in the exposure amount and printing was also determined. The results obtained are shown in Table I-1.

TABLE I-1

| Example | Hydrophilic Support | Heat-Sensitive Layer | Sensitivity | Printing Durability |
|---|---|---|---|---|
| I-1 | I-2 | (I-1) | 300 mJ/cm$^2$ | 20,000 |
| I-2 | I-2 | (I-1) | 350 mJ/cm$^2$ | 20,000 |
| I-3 | I-2 | (I-2) | 400 mJ/cm$^2$ | 20,000 |
| I-4 | I-4 | (I-1) | 350 mJ/cm$^2$ | 20,000 |
| Comparative Example I-1 | Aluminum | (I-1) | 700 mJ/cm$^2$ | 10,000 |

It is seen from the results shown above that the support having the hydrophilic surface comprising the graft polymer according to the invention can provide a lithographic printing plate precursor having high sensitivity and excellent printing durability in comparison with a conventional hydrophilic aluminum support.

<Preparation of Fine Particulate Polymer (II-1) Having Mutually Acting Group>

5.5 g of N-vinylpyridine, 7.5 g of butyl methacrylate and 200 ml of an aqueous solution of polyoxyethylene nonylphenol (concentration: 9.84×10$^{-3}$ mol/liter) were added to a vessel, and the atmosphere within the vessel was replaced by a nitrogen gas while stirring at 250 rpm. After adjusting the temperature of the solution at 25° C., 10 ml of an aqueous solution of cerium (IV) ammonium salt (concentration; 0.984×10$^{-3}$ mol/liter) was added thereto. At that tome, pH was adjusted to 1.3 to 1.4 by adding an aqueous solution of ammonium nitrate (concentration: 58.8×10$^{-3}$ mol/liter). Then, the solution was stirred for 8 hours. The resulting solution had a solid content concentration of 9.5%, and an average particle size of the particulate polymer was 0.3 $\mu$m.

<Preparation of Fine Particulate Polymer (II-2) Having Mutually Acting Group>

9.0 g of N-triethylammonium methylstyrenetosilate, 6.5 g of butyl methacrylate and 200 ml of an aqueous solution of polyoxyethylene nonylphenol (concentration: 9.84×10$^{-3}$ mol/liter) were added to a vessel, and the atmosphere within the vessel was replaced by nitrogen gas while stirring at 250 rpm. After adjusting the temperature of the solution at 25° C., 10 ml of an aqueous solution of cerium (IV) ammonium salt (concentration; 0.984×10$^{-3}$ mol/liter) was added thereto. At that time, pH was adjusted to 1.3 to 1.4 by adding an aqueous solution of ammonium nitrate (concentration: 58.8×10$^{-3}$ mol/liter). Then, the solution was stirred for 8 hours. The resulting solution had a solid content concentration of 9.0%, and an average particle size of the particulate polymer was 0.1 $\mu$m.

<Preparation of Fine Particulate Polymer (III-1) Having No Mutually Acting Group>

The polymerization procedure was conducted in the same manner as in the preparation of fine particulate polymer (II-1) except for using 15 g of butyl methacrylate in place of N-vinylpyridine and butyl methacrylate. The resulting dispersion of polybutyl methacrylate homopolymer had a solid content concentration of 9.5% by weight, and an average particle size of the particulate polymer was 0.2 $\mu$m.

<Preparation of Microcapsule (II-1)>

40 g of xylene diisocyanate, 10g of N-vinylpyridine/butyl methacrylate copolymer (molar ratio: 7/3) and 0.1 g of Pionin A41C (manufactured by Takemoto Oil & Fat Co., Ltd.) were dissolved in 60 g of ethyl acetate to prepare an oil phase component. As an aqueous phase component, 120 g of a 4% aqueous solution of PV A205 (manufactured by Kuraray Co., Ltd.) was prepared. The oil phase component and the aqueous phase component were emulsified at 10,000 rpm using a homogenizer. Subsequently, 40 g of water was added thereto, followed by stirring at room temperature for 30 minutes, then at 40° C. for 3 hours. The resulting microcapsule solution had a solid content concentration of 20%, and an average particle size of the microcapsules was 0.7 $\mu$m.

<Preparation of Hydrophilic Supports II-1 and II-2>

On a 0.188-mm thick, biaxially stretched PET film (M4100; manufactured by Toyabo Co., Ltd.) was coated the following photo-polymerizable composition using a rod bar No. 17, followed by drying at 80° C. for 2 minutes. The coated film was irradiated using a 400 W high pressure mercury lamp (UVL-400P; manufactured by Riko Kagaku Sangyo Co., Ltd.) for 10 minutes. Then, the film was immersed in a 10% aqueous solution of acrylic acid in an argon atmosphere and irradiated using the 400 W high pressure mercury lamp for 30 minutes. The film was thoroughly washed with ion-exchanged water.

| | |
|---|---|
| Allyl methacrylate/methacrylic acid copolymer (molar ratio: 80/20; molecular weight: 100,000) | 4 g |
| Ethylene oxide-modified bisphenol A diacrylate (M210; manufactured by Toagosei Co., Ltd.) | 4 g |
| 1-Hydroxycyclohexyl phenyl ketone | 1.6 g |
| 1-Methoxy-2-propanol | 16 g |

A 188-m thick, biaxially stretched polyethylene terephthalate film (A4100; manufactured by Toyobo Co., Ltd.) was subjected to an oxygen glow treatment using a flat plate magnetron sputtering apparatus (CFS-10-EP70; manufactured by Shibaura Eletec Corp.) under the following conditions.

Initial vacuum: 1.2×10$^{-3}$ Pa
Oxygen pressure: 0.9 Pa
RF glow: 1.5 KW
Treating time: 60 sec Then, the glow-treated film was immersed in a 10% by weight aqueous solution of sodium styrenesulfonate for 7 hours at 70° C. under bubbling nitrogen gas therein. The film was washed with water for 8 hours to obtain a support (hydrophilic support II-1) having a graft chain of sodium styrenesulfonate on the surface thereof.

Also, the same procedure as described above was conducted except for changing sodium styrenesulfonate to acrylic acid to obtain a support (hydrophilic support II-2) having a graft chain of acrylic acid on the surface thereof.

The following coating solution for a heat-sensitive layer (II-1) or (II-2) was coated on the hydrophilic support II-1 or II-2 and dried in an oven at 100° C. for 60 sec to prepare a heat-sensitive layer of 0.5 g/m$^2$ in a dry coated amount.

| Coating solution for heat-sensitive layer (II-1) | |
|---|---|
| Fine particulate polymer (shown in Table II-1) | 5 g as solid content) |
| Polyhydroxyethyl acrylate (weight average molecular weight: 25,000) | 0.5 g |
| IR ray-absorbing dye (IR-11) shown above | 0.3 g |
| Water | 100 g |
| Coating solution for heat-sensitive layer (II-2) | |

-continued

| | |
|---|---|
| Microcapsule (II-1) | 5 g (as solid content) |
| Polyhydroxyethyl acrylate (weight average molecular weight: 25,000) | 2.5 g |
| IR ray-absorbing dye (IR-11) shown above | 0.3 g |
| Water | 60 g |
| 1-Methoxy-2-propanol | 40 g |

EXAMPLES II-1 to II-6

Lithographic printing plate precursors of Examples II-1 to II-6 were prepared according to the combinations of the hydrophilic support and the heat-sensitive layer shown in the Table II-1 below.

COMPARATIVE EXAMPLE II-1

A lithographic printing plate precursor was prepared in the same manner as in Example II-1 except for using the following aluminum support having a hydrophilic surface without the hydrophilic graft polymer as the hydrophilic support.

An aluminum plate (JIS A1050; thickness: 0.24 mm) was electrolytically grained in a nitric acid bath, anodized in a sulfuric acid bath, and then treated with an aqueous silicate solution in a known manner. The resulting aluminum support had an Ra (centerline surface roughness) of 0.25 um, an anodic oxidization film in an amount of 2.5g/m$^2$, and deposited silicon in an amount of 10 mg/m$^2$.

Each of the on press-developable lithographic printing plate precursors obtained in Examples II-1 to II-6 and Comparative Example II-1 was exposed using Trendsetter 3244VFS manufactured by Creo Inc. equipped with a water-cooling type 40W infrared semiconductor laser and, without any processing, mounted on a cylinder of a printing press SOR-M manufactured by Heidelberg Inc., followed by conducting printing with supplying dampening water, printing ink, and paper in this order.

An exposure amount necessary for forming an image (sensitivity) was determined with each of the printing plate precursors, and printing durability represented in terms of number of printed matter obtained by exposing in the exposure amount and printing was also determined. The results obtained are shown in Table II-1.

TABLE II-1

| | Support | Heat-Sensitive Layer | | Sensitivity (mJ/cm$^2$) | Printing Durability |
|---|---|---|---|---|---|
| Example II-1 | Hydrophilic Support II-1 | Heat-Sensitive Layer (II-1) | Particulate Polymer (II-1) | 330 | 30,000 |
| Example II-2 | Hydrophilic Support II-1 | Heat-Sensitive Layer (II-1) | Particulate Polymer (II-2) | 350 | 25,000 |
| Example II-3 | Hydrophilic Support II-1 | Heat-Sensitive Layer (II-2) | Microcapsule (II-1) | 350 | 28,000 |
| Example II-4 | Hydrophilic Support II-2 | Heat-Sensitive Layer (II-1) | Particulate Polymer (II-1) | 280 | 20,000 |
| Example II-5 | Hydrophilic Support II-2 | Heat-Sensitive Layer (II-2) | Microcapsules (II-1) | 250 | 25,000 |
| Example II-6 | Hydrophilic Support II-1 | Heat-Sensitive Layer (II-1) | Particulate Polymer (III-1) | 350 | 5,000 |
| Comparative Example II-1 | Hydrophilic Aluminum Plate | Heat-Sensitive Layer (II-1) | Particulate Polymer (II-1) | 800 | 8,000 |

It is seen from the results shown above that the lithographic printing plate precursors of the invention having the hydrophilic surface containing the hydrophilic graft polymer enable to conduct recording with high sensitivity. On the contrary, the lithographic printing plate precursor of Comparative Example II-1 using a conventional hydrophilic aluminum support was much inferior to the precursors of the invention in the sensitivity. Also, the lithographic printing plate precursors containing the fine particulate polymer or microcapsules having the functional group capable of mutually acting with the graft polymer according to the invention have the excellent printing durability.

According to the invention, an on press developable lithographic printing plate precursor which can be mounted on a printing press as it is after exposure to conduct printing and shows the good on press developability, high sensitivity and excellent printing durability.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor which comprises a support having a hydrophilic surface containing hydrophilic graft polymer chains and a heat-sensitive layer containing at least either of fine particulate polymer and microcapsules.

2. The lithographic printing plate precursor as claimed in claim 1, wherein the fine particulate polymer is a thermoplastic fine particulate polymer.

3. The lithographic printing plate precursor as claimed in claim 1, wherein the fine particulate polymer is a fine particulate polymer having a heat-reactive functional group.

4. The lithographic printing plate precursor as claimed in claim 1, wherein the microcapsules retain a compound having a heat-reactive functional group.

5. The lithographic printing plate precursor as claimed in claim 1, wherein the fine particulate polymer is a thermoplastic fine particulate polymer having functional group capable of mutually acting with the hydrophilic graft polymer.

6. The lithographic printing plate precursor as claimed in claim 1, wherein the microcapsules are microcapsules retaining a compound having a functional group capable of mutually acting with the hydrophilic graft polymer.

* * * * *

UNITED STATES PATENT AND TRADEMARK OFFICE

CERTIFICATE OF CORRECTION

PATENT NO. : 6,566,029 B2
DATED : May 20, 2003
INVENTOR(S) : Koichi Kawamura et al.

It is certified that error appears in the above-identified patent and that said Letters Patent is hereby corrected as shown below:

Title page,
Add the following:
-- [30] Foreign Application Priority Data

| | | | |
|---|---|---|---|
| Dec. 13, 2000 | (JP) | ........................... | 2000-378955 |
| Feb. 28, 2001 | (JP) | ........................... | 2001-053868 -- |

Signed and Sealed this

Twenty-seventh Day of April, 2004

JON W. DUDAS
*Acting Director of the United States Patent and Trademark Office*